United States Patent
Dhindsa et al.

(10) Patent No.: US 7,525,787 B2
(45) Date of Patent: Apr. 28, 2009

(54) ELECTROSTATIC CHUCK ASSEMBLY WITH DIELECTRIC MATERIAL AND/OR CAVITY HAVING VARYING THICKNESS, PROFILE AND/OR SHAPE, METHOD OF USE AND APPARATUS INCORPORATING SAME

(75) Inventors: Rajinder Dhindsa, San Jose, CA (US); Eric Lenz, Pleasanton, CA (US); Lumin Li, Santa Clara, CA (US); Felix Kozakevich, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 484 days.

(21) Appl. No.: 11/239,395

(22) Filed: Sep. 30, 2005

(65) Prior Publication Data

US 2007/0076346 A1    Apr. 5, 2007

(51) Int. Cl.
- H01L 21/683 (2006.01)
- H01T 23/00 (2006.01)
- H05F 3/00 (2006.01)
- F41B 15/04 (2006.01)
- H01G 7/02 (2006.01)

(52) U.S. Cl. ............. 361/234; 361/230; 361/231; 361/232; 361/233

(58) Field of Classification Search .......... 361/231–234
See application file for complete search history.

(56) References Cited

U.S. PATENT DOCUMENTS

| | | | |
|---|---|---|---|
| 5,583,736 | A | 12/1996 | Anderson et al. |
| 5,944,902 | A | 8/1999 | Redeker et al. |
| 6,228,438 | B1 | 5/2001 | Schmitt |
| 6,228,439 | B1 | 5/2001 | Watanabe et al. |
| 6,306,247 | B1 | 10/2001 | Lin |
| 6,452,775 | B1 * | 9/2002 | Nakajima ............... 361/234 |
| 6,522,519 | B1 | 2/2003 | Hirayanagi |
| 6,625,003 | B2 | 9/2003 | Loo et al. |
| 6,639,783 | B1 | 10/2003 | Shamouilian et al. |
| 6,693,790 | B2 | 2/2004 | Matsuki et al. |
| 6,721,162 | B2 | 4/2004 | Weldon et al. |
| 6,754,062 | B2 | 6/2004 | Logan et al. |

(Continued)

OTHER PUBLICATIONS

C. T. Gabriel et al., "Measuring and controlling wafer temperature during plasma etching", *MicroMagazine.com* [Online], [retrieved on Sep. 30, 2005], Retrieved from the Internet: <URL:www.micromagazine.com/archive/01/06/Gabriel.html>.

(Continued)

Primary Examiner—Stephen W Jackson
Assistant Examiner—Dharti H Patel
(74) Attorney, Agent, or Firm—Buchanan Ingersoll & Rooney PC

(57) ABSTRACT

An electrostatic chuck assembly having a dielectric material and/or having a cavity with varying thickness, profile and/or shape is disclosed. The electrostatic chuck assembly includes a conductive support and an electrostatic chuck ceramic layer. A dielectric layer or insert is located between the conductive support and an electrostatic chuck ceramic layer. A cavity is located in a seating surface of the electrostatic chuck ceramic layer. An embedded pole pattern can be optionally incorporated in the electrostatic chuck assembly. Methods of manufacturing the electrostatic chuck assembly are disclosed as are methods to improve the uniformity of a flux field above a workpiece during a plasma processing process.

32 Claims, 13 Drawing Sheets

U.S. PATENT DOCUMENTS

| | | |
|---|---|---|
| 6,839,217 B1 | 1/2005 | Larsen |
| 6,847,014 B1 | 1/2005 | Benjamin et al. |
| 6,898,065 B2 | 5/2005 | Mays et al. |
| 7,431,788 B2 | 10/2008 | Ricci et al. |
| 2004/0211385 A1 | 10/2004 | Lee |
| 2005/0079729 A1 | 4/2005 | Jang |
| 2005/0173403 A1 | 8/2005 | Benjamin et al. |
| 2005/0173404 A1 | 8/2005 | Benjamin et al. |
| 2005/0211385 A1 | 9/2005 | Benjamin et al. |

OTHER PUBLICATIONS

M. Sun et al., Direct Wafer Temperature Measurements for Etch Chamber Diagnostics and Process Control [Online], SensArray Corporation [retrieved on Sep. 30, 2005], Retrieved from the Internet: <URL:www.sensarray.com/public/docs/white%20papers/ASMCMay2002.pdf>.

* cited by examiner

Mean : 183.1 nm
3-sigma : 8.7 nm (4.7%)
Range : 11.4 nm (6.2%)

ELECTROSTATIC CHUCK ASSEMBLY WITH DIELECTRIC MATERIAL AND/OR CAVITY HAVING VARYING THICKNESS, PROFILE AND/OR SHAPE, METHOD OF USE AND APPARATUS INCORPORATING SAME

FIELD OF THE DISCLOSURE

The present disclosure relates generally to an apparatus for and a method of manufacturing a semiconductor device. More specifically, the present disclosure relates to an electrostatic chuck assembly, for example for supporting a semiconductor wafer in a plasma deposition apparatus, with a dielectric insert and/or a cavity having varying thickness, profile and/or shape, a method of use of the electrostatic chuck assembly in a plasma etch process and an apparatus incorporating the electrostatic chuck assembly.

BACKGROUND

In the discussion that follows, reference is made to certain structures and/or methods. However, the following references should not be construed as an admission that these structures and/or methods constitute prior art. Applicant expressly reserves the right to demonstrate that such structures and/or methods do not qualify as prior art against the present invention Electrostatic chucks, and/or susceptors, are employed to support a wafer, substrate or another type of workpiece during the manufacture of semiconductor devices. Typical electrostatic chucks include an electrically conductive electrode that is mounted on a pedestal and covered by a seating surface. High-temperature processes such as sputter-etching and ion bombardment use high-purity ceramic material for seating surfaces to reduce contamination. Other seating surfaces include electrically insulative, dielectric material, high-purity ceramic, metal oxide, and other materials such as sapphire (single-crystal $Al_2O_3$). Different types of electrostatic chucks include bipolar designs based on dual electrodes in the chuck and monopolar chucks with a single electrode.

During manufacturing processes in plasma processing apparatus, the workpiece sits on top of the seating surface and a voltage source electrically biases the electrode so that electric charge accumulates in the electrode and the seating surface. The applied voltage also induces an equal and opposite charge on the rear surface of the workpiece. The accumulated electric charge generates an electrostatic force that attracts and clamps the workpiece against the seating surface of the electrostatic chuck.

While the workpiece is clamped, various processes can be employed, such as chemical vapor deposition, ion implantation, ion beam milling and reactive ion etching. During the various processes, substrate temperatures are regulated with confined gas such as helium that flows onto the backside of the workpiece.

SUMMARY

An embodiment of an electrostatic chuck assembly for a plasma processing apparatus, comprises a conductive support operatively connected to a connector for connection to a RF circuit of the plasma processing apparatus, an electrostatic chuck ceramic layer having a first surface in contact with the conductive support at at least a first region of a first interface and a second opposing surface for seating of a semiconductor substrate, a cavity in the conductive support at a second region of the first interface, and a dielectric material insert in the cavity.

Another embodiment of an electrostatic chuck assembly for a plasma processing apparatus comprises a conductive support having a first surface and a second surface, the first surface operatively connected to a connector for connection to a RF circuit of the plasma processing apparatus, a dielectric material layer contacting the second surface of the conductive support to form a first interface, and an electrostatic chuck ceramic layer having a first surface in contact with the dielectric material layer at a second interface. The conductive support, the dielectric material layer and the electrostatic chuck ceramic layer form a multilayer structure.

A further embodiment of an electrostatic chuck assembly for a plasma processing apparatus comprises a conductive support operatively connected to a connector for connection to a RF circuit of the plasma processing apparatus, the conductive support having a first surface and a second surface, an electrostatic chuck ceramic layer having a first surface contacting the second surface of the conductive support to form a first interface and having a second surface to receive a workpiece, and a cavity in the second surface.

An exemplary method of manufacturing an electrostatic chuck assembly, the electrostatic chuck including a conductive support operatively connected to a connector for connection to a RF circuit of a plasma processing apparatus and an electrostatic chuck ceramic layer, comprises forming a cavity in a region of a surface of the conductive support, the surface in contact with the electrostatic chuck ceramic layer, and incorporating a dielectric material into the cavity.

Another exemplary method of manufacturing an electrostatic chuck assembly, the electrostatic chuck including a conductive support operatively connected to a connector for connection to a RF circuit of a plasma processing apparatus and an electrostatic chuck ceramic layer, comprises forming a multilayer structure including the conductive support and the electrostatic chuck ceramic layer, and at least one of forming a cavity in a region of a free-surface of the electrostatic chuck ceramic layer and forming a dielectric material layer between the conductive support and the electrostatic chuck ceramic layer.

An exemplary method to improve the uniformity of a flux field above a workpiece during a plasma processing process comprises incorporating a dielectric material into a region of an electrostatic chuck assembly, mounting the workpiece to the electrostatic chuck assembly, and establishing the flux field above the workpiece. A value of the flux field above the region with the incorporated dielectric material during the plasma processing process is less than an original value of the flux field for an electrostatic chuck assembly without the incorporated dielectric material. The region with the incorporated dielectric material is between a conductive support operatively connected to a connector for connection to a RF circuit of a processing apparatus and an electrostatic chuck ceramic layer.

Another exemplary method to improve the uniformity of a flux field above a workpiece during a plasma processing process comprises forming a cavity in an outer surface of an electrostatic chuck ceramic layer of an electrostatic chuck assembly, mounting the workpiece to the outer surface of the electrostatic chuck ceramic layer so that the cavity is covered by the workpiece, and establishing the flux field above the workpiece. A value of the flux field above the region with the incorporated dielectric material during the plasma processing process is less than an original value of the flux field for an electrostatic chuck assembly without the incorporated dielectric material.

BRIEF DESCRIPTION OF THE DRAWING FIGURES

The following detailed description of preferred embodiments can be read in connection with the accompanying drawings in which like numerals designate like elements and in which:

FIG. 12A is the result for a workpiece on a standard electrostatic chuck assembly and FIG. 12B is the result for a workpiece on an exemplary embodiment of an electrostatic chuck assembly with a cavity in a seating surface of an electrostatic chuck ceramic layer.

DETAILED DESCRIPTION

In a plasma processing apparatus, such as a parallel plate plasma etch reactor, wherein process gas is supplied through a showerhead electrode and a workpiece, such as a semiconductor substrate, supported on an electrostatic chuck assembly is plasma etched by plasma generated by supplying RF energy to the showerhead and/or the electrostatic chuck assembly, plasma uniformity can be affected by RF coupling between the lower electrode assembly and the plasma. To improve the plasma uniformity, the electrostatic chuck assembly is modified, for example, by inclusion of a dielectric material insert, a dielectric material layer, and/or a cavity in a layer of the electrostatic chuck assembly, to modify the electric field above the workpiece and thus to modify the plasma. The electrostatic chuck assembly comprises a conductive support, an electrostatic chuck ceramic layer, and a dielectric material insert, a dielectric material layer, and/or a cavity in a layer of the electrostatic chuck. An embedded pole pattern in the electrostatic chuck ceramic layer may optional be included in the electrostatic chuck assembly. Incorporation of the dielectric material insert, dielectric material layer, and/or cavity in a layer of the electrostatic chuck assembly can increase plasma etching uniformity of the workpiece. Other features of the electrostatic chuck assembly include a baseplate (also called a lower electrode) formed of a conductive material. The lower electrode can be powered by an RF source and attendant circuitry for providing RF matching, etc. The lower electrode is preferably temperature controlled and may optionally include a heating arrangement. Both coulomb force type (using dielectric insulators) and Johnson-Rahbeck force type (using semiconductors having natural resistance $10^8$ to $10^{13}$ $\Omega \cdot cm$) electrostatic chuck assemblies can be used.

Figure 1:
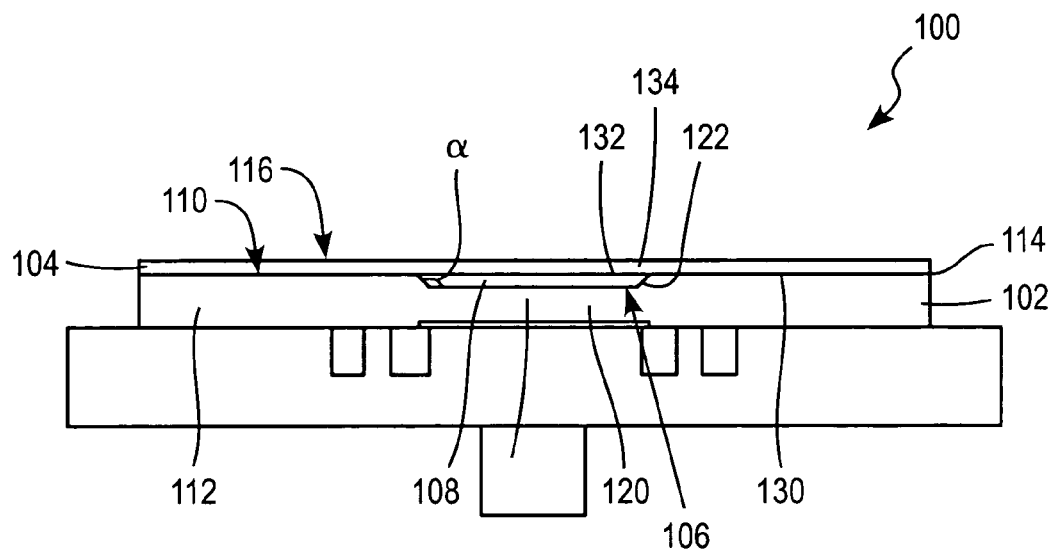
FIG. 1 shows a schematic cross-sectional view of an exemplary embodiment of an electrostatic chuck assembly with a dielectric material insert in a cavity of a conductive support and below an electrostatic chuck ceramic layer.

FIG. 1 shows an exemplary embodiment of an electrostatic chuck assembly 100. The electrostatic chuck assembly 100 in FIG. 1 comprises a conductive support 102, an electrostatic chuck ceramic layer 104, a cavity 106, and a dielectric material insert 108 in the cavity 106. The conductive support 102, formed of a conductive metal such as aluminum, is operatively connected to a connector for connection to a RF circuit of a plasma processing apparatus (not shown) for plasma processing a workpiece, such as a 200 mm or 300 mm wafer, seated on the electrostatic chuck ceramic layer 104.

In the electrostatic chuck assembly 100 in FIG. 1, the electrostatic chuck ceramic layer 104 has a first surface 110 in contact with the conductive support 102 at at least a first region 112 of a first interface 114 and a second opposing surface 116 for seating of a semiconductor substrate (not shown). The electrostatic chuck ceramic layer 104 is formed of, for example, dielectric insulator materials and/or semiconductors.

The cavity 106 of the electrostatic chuck assembly 100 is formed in the conductive support 102 at a second region 120 of the first interface 114. For example, the cavity 106 is milled in the conductive support 102. In exemplary embodiments, the cavity 106 is substantially disc-shaped, e.g., having an eccentricity of between 0 and 0.25, and has an outer edge 122.

In exemplary embodiments, the dielectric material insert 108 is located in the cavity 106 and, for example, is bonded into the cavity 106. Other methods to form and/or mount the dielectric material insert include deposition directly into the cavity, e.g., by plasma spray coating, by chemical vapor deposition, or by other physical and chemical vapor deposition techniques. The dielectric material insert 108 can be any suitable shape and/or profile. For example, the dielectric material insert 108 can occupy essentially all of a volume of the cavity 106 and has a first surface 130 continuous with the first interface 114. In another example, the dielectric material insert 108 has a radially varying cross-sectional thickness. In still another example, the cavity 106 and the dielectric material insert 108 are substantially the same shape. One suitable shape includes disc-shaped or substantially disc-shaped, e.g., having an eccentricity of between 0 and 0.25.

In a further example, an embodiment of the dielectric material insert 108 has an outer edge 132 that meets the outer edge 122 of the cavity 106 at a second interface 134. The second interface 104 has an average slope that forms an angle ($\alpha$) with a plane containing the first interface 114. The angle ($\alpha$) can be, in some embodiments, 90 degrees, e.g., the average slope and the first interface are perpendicular, and can, in other embodiments, deviate from 90 degrees, e.g., the average slope and the first interface are non-perpendicular. In a preferred embodiment, the angle ($\alpha$) is in a range of greater than zero to less than or equal to 45 degrees, alternatively less than 15 degrees, alternatively less than 6 degrees, and alternatively less than 3 degrees. As shown herein, the angle affects the shape of the electric field formed in the plasma processing process.

Figure 2:
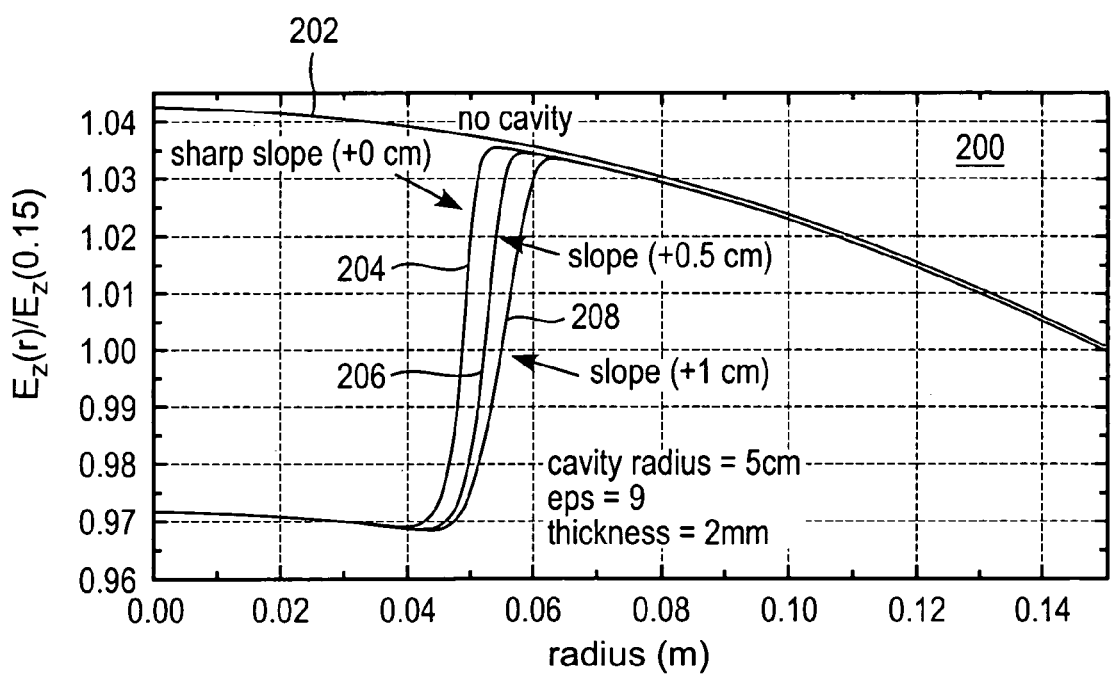
FIG. 2 is a graph showing the effect of changes in angle ($\alpha$) on the electric field formed in the plasma processing process for the exemplary embodiment of an electrostatic chuck assembly in FIG. 1.

FIG. 2 is a graph 200 showing the effect of changes in angle ($\alpha$) on the electric field formed in the plasma processing process. The electric field ($E_z(r)/E_z(0.15)$) is depicted as a function of radial position (radius) for the exemplary embodiment of an electrostatic chuck assembly in FIG. 1. In FIG. 2, the field has been normalized to the field at a 15 cm radial distance. Other parameters for the graph 200 include a cavity radius of 5 cm (cavity radius measured at the base of the cavity), a thickness of the dielectric material insert of 2 mm, and an electrostatic chuck power supply setting (eps) of 9. Curve 202 is the electric field for an electrostatic chuck assembly without a cavity and a dielectric material insert. Curve 204 is the electric field for an electrostatic chuck assembly with a cavity and a dielectric material insert where the angle ($\alpha$) is 90 degrees. Curve 204 is the electric field for an electrostatic chuck assembly with a cavity and a dielectric material insert where the first surface of the dielectric material insert is the same radial dimension as the base of the cavity, e.g., is perpendicular or has an angle ($\alpha$) of 90 degrees. Curve 206 is the electric field for an electrostatic chuck assembly with a cavity and a dielectric material insert where the first surface of the dielectric material insert has a radial dimension that is 0.5 cm larger than the radial dimension at the base of the cavity, e.g., is non-perpendicular or has an angle ($\alpha$) of less than 6 degrees, alternatively less than 3 degrees. Curve 208 is the electric field for an electrostatic chuck assembly with a cavity and a dielectric material insert where the first surface of the dielectric material insert has a radial dimension that is 1 cm larger than the radial dimension at the base of the cavity, e.g., is non-perpendicular or has an angle ($\alpha$) of less than 3 degrees, alternatively less than 1.5 degrees. As can be seen in FIG. 2, the step change in electric field is sharpest for the perpendicular case than for the non-perpendicular case.

Preferably, the dielectric material insert 108 is formed from one dielectric material. However, in some embodiments, more than one dielectric material can be used, for example, where the dielectric constant of the selected materials are substantially similar, e.g., similar enough not to adversely effect the field of the plasma processing process, and in other embodiments, more than one dielectric material can be used, for example, where the dielectric constant of the selected materials are substantially different, e.g., different enough to change the field of the plasma processing process. In preferred embodiments, the dielectric material insert 108 is formed from boron nitride or aluminum nitride.

As an example and for a 15 cm radius electrostatic chuck assembly, an exemplary embodiment of the dielectric material insert can be substantially disc-shaped having a diameter of about 12 cm or less, alternatively about 10 cm or less, and a thickness of about 5 mm or less, alternatively about 2 mm or less. Similar and related values can be used for electrostatic chuck assemblies having different radii.

Figure 3:
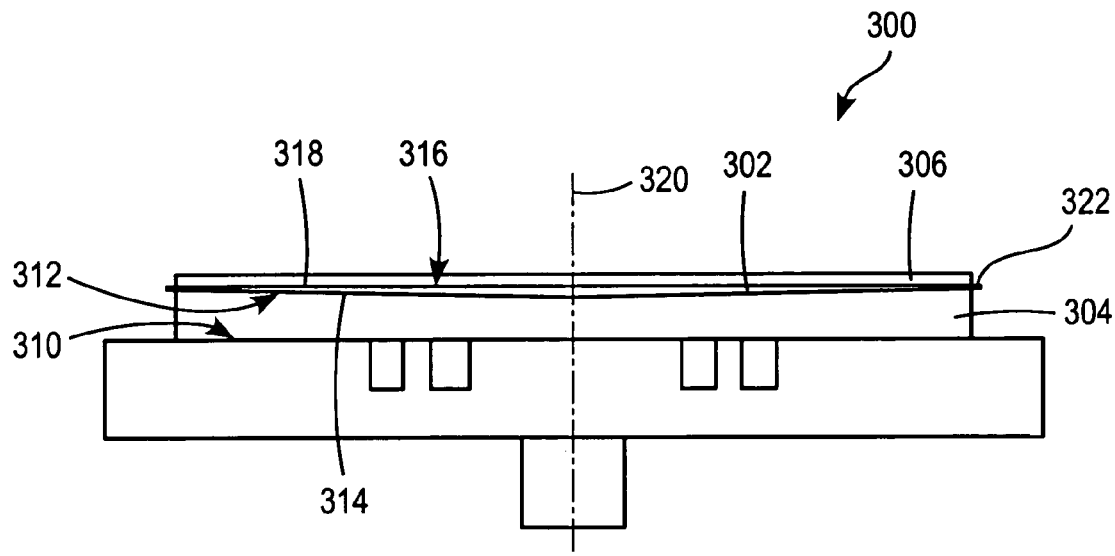
FIG. 3 shows a schematic cross-sectional view of another exemplary embodiment of an electrostatic chuck-assembly with a dielectric material layer between a conductive support and an electrostatic chuck ceramic layer.

FIG. 3 shows a schematic cross-sectional view of another exemplary embodiment of an electrostatic chuck assembly 300 with a dielectric material layer between a conductive support and an electrostatic chuck ceramic layer. The exemplary embodiment of an electrostatic chuck assembly 300 comprises a conductive support 304, a dielectric material layer 302, and an electrostatic chuck ceramic layer 306. The conductive support 304, formed of a conductive metal such as aluminum, is operatively connected to a connector for connection to a RF circuit of a plasma processing apparatus (not shown) for plasma processing a workpiece, such as a 200 mm or 300 mm semiconductor wafer, seated on the electrostatic chuck ceramic layer 306.

In the exemplary embodiment of FIG. 3, the conductive support 304, the dielectric material layer 302 and the electrostatic chuck ceramic layer 306 form a multilayer structure. For example, the conductive support 304 has a first surface 310 and a second surface 312. The first surface 310 is operatively connected to a connector for connection to a RF circuit of the plasma processing apparatus. The dielectric material layer 302 contacts the second surface 312 of the conductive support 304 to form a first interface 314. A first surface 316 of the electrostatic chuck ceramic layer 306 contacts the dielectric material layer 302 at a second interface 318.

In one exemplary embodiment, the dielectric material layer 302 has a thickness (t) that varies radially from a center axis 320 to an outer edge 322.

For example, the dielectric material layer 302 can include one dielectric material formed into the dielectric material layer 302 or can include more than one dielectric material, each of the dielectric materials having substantially similar dielectric constants. To have a radially varying dielectric constant for the dielectric material layer 302, an embodiment of the dielectric material layer 302 has three regions in cross-section. The radial variation can be substantially continuous or discontinuous.

Figure 4A:
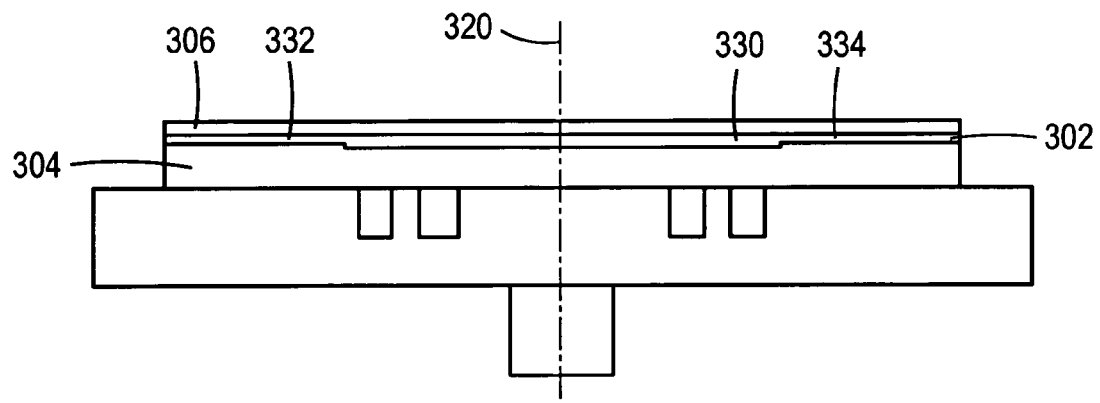
FIGS. 4A and 4B show schematic cross-sectional views of another exemplary embodiment of an electrostatic chuck assembly with a discontinuous interface (FIG. 4A) and a continuous interface (FIG. 4B).

In one example schematically depicted in FIG. 4A, the dielectric material layer 302 is thicker in a radially center region 330 than in either of a first radially edge region 332 or a second radially edge region 334. At the interface between the radially center region 330 and the first radially edge region 332 or the second radially edge region 334, the dielectric material layer 302 can change thickness resulting in a discontinuous interface. The changed thickness can be abrupt, e.g., over the distance of millimeters or less, or can be gradual, over the distance of centimeters or less, depending on the desired effect on the dielectric constant and on the electric field.

Figure 4B:
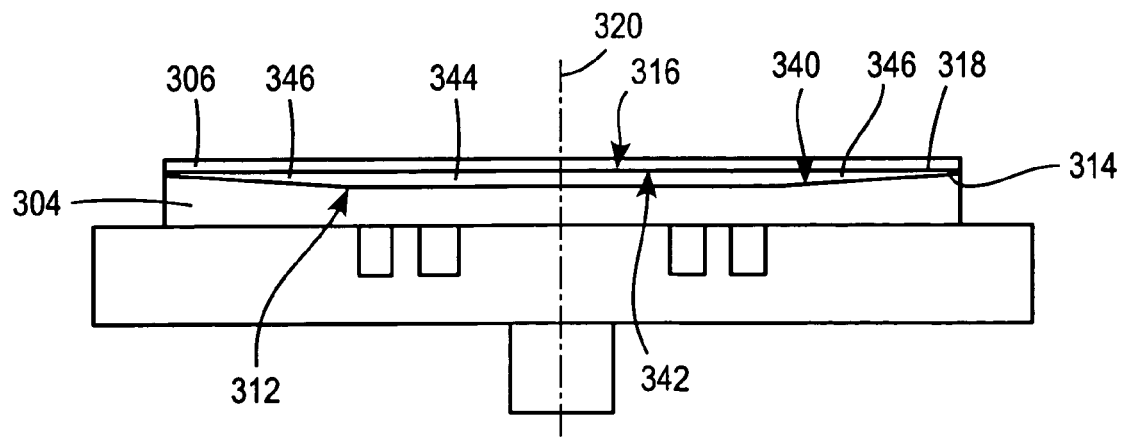

In another example schematically depicted in FIG. 4B, the dielectric material layer 302 has a tapered surface 340 and a planar surface 342. The tapered surface 340 can, for example, be continuously tapering or substantially continuously tapering from a center region outward. FIG. 3 shows an example of a continuously tapering tapered surface and FIG. 4B shows an example of a substantially continuously tapering tapered surface. In FIG. 4B, the tapered surface 340 is substantially continuously tapering with a first region 344 of a uniform thickness and a second region 346 in which the thickness varies and is tapered. The second surface 312 of the conductive support 304 is complementarily shaped to conform to the tapered surface 340 of the dielectric material layer 302 at the first interface 314 and the planar surface 342 of the dielectric material layer 302 contacts the first surface 316 of the electrostatic chuck ceramic layer 306 at the second interface 318. The transitions along the tapered surface 340 are generally continuous and produce a continuous interface.

In each of the above examples, the thickness at various radial points along the dielectric material layer 302 is such that a desired value of a dielectric constant is achieved. The value is selected, at least in part, based on the influence the dielectric constant has on the electric field with subsequent influence on the plasma processing process, such as by the development of a more uniform electric field. For example, the values of the dielectric constant of the dielectric material layer in the radially center region can be lower than a dielectric constant of the dielectric material layer in the first radially edge region and the second radially edge region. The lower dielectric constant correlates to a lower capacitive coupling and a suppressed etch rate. Alternatively, the values of the dielectric constant of the dielectric material layer in the radially center region is lower than a dielectric constant of the dielectric material layer in the first radially edge region or a dielectric constant of the dielectric material layer in the second radially edge region. Further variations can include, for example, the radially edge regions having the same, having similar and/or having dissimilar values for the dielectric constants in the respective regions. The variations in the values of the dielectric constant in the various regions can be altered by one or more of choosing materials having different dielectric constants at a particular thickness and choosing materials having the same or substantially the same dielectric constants and varying the thickness.

Figure 5:
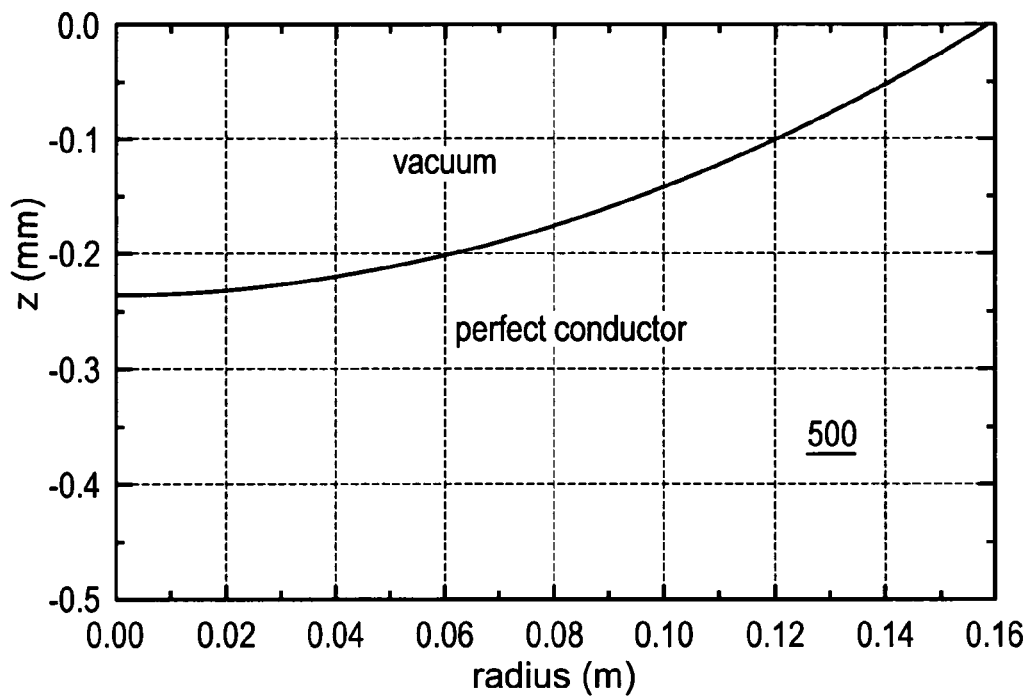
FIG. 5 is a graph showing the thickness of a tapered dielectric material layer as a function of radial position for the exemplary embodiment of an electrostatic chuck assembly in FIG. 4B.

FIG. 5 is a graph 500 showing the thickness of a continuously tapered dielectric material layer as a function of radial position for the exemplary embodiment of an electrostatic chuck assembly in FIG. 3. In the FIG. 5 graph, the radial position varies from 0 (indicating the center axial position) to 16 cm (at the outer edge) and the thickness (z) varies from about 0 at the outer edge to about 0.25 mm at the center axial position. An exemplary relationship for thickness of a tapered dielectric material layer as a function of radial position is generally logarithmic and continuous, although other relationships including discontinuous relationships may be used.

Figure 6:
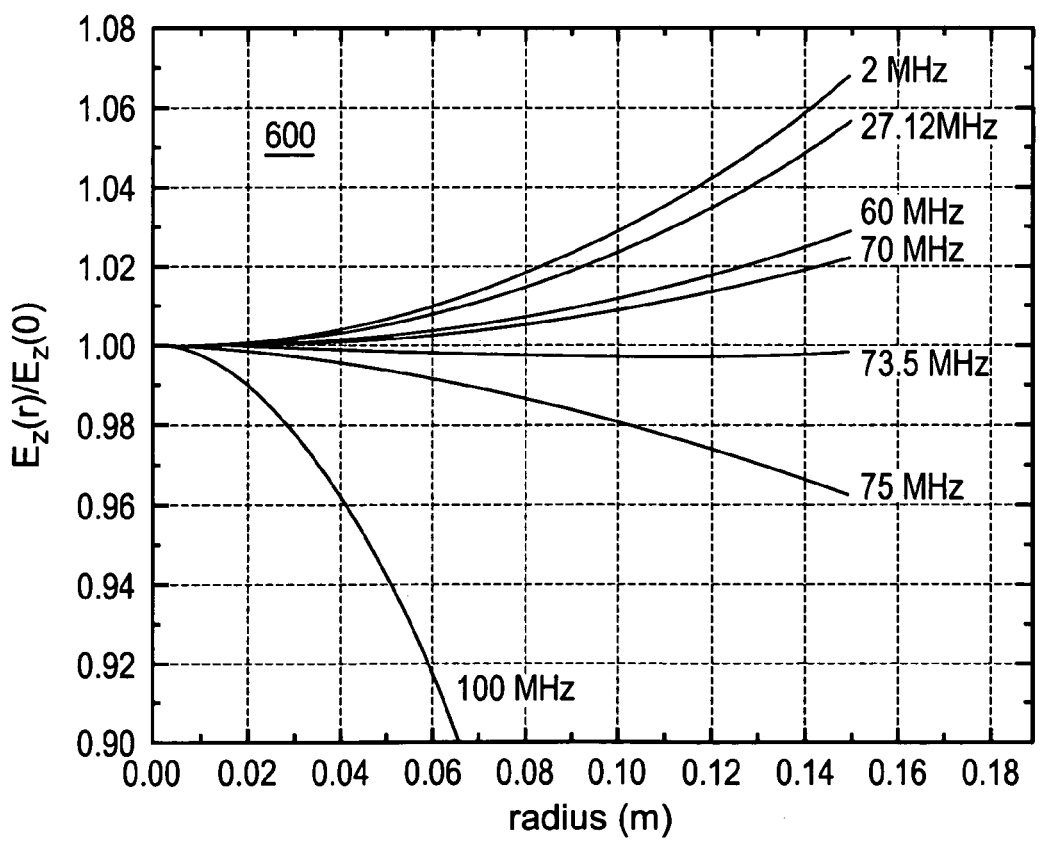
FIG. 6 is a graph showing the normalized electric field formed in the plasma processing process as a function of radial position at various operating frequencies for the exemplary embodiment of the electrostatic chuck assembly in FIG. 4B and having the thickness of the tapered dielectric material layer as presented in FIG. 5.

FIG. 6 is a graph showing the normalized electric field $(E_z(r)/E_z(0))$ formed in the plasma processing process as a function of radial position (r) at various operating frequencies for the exemplary embodiment of the electrostatic chuck assembly in FIG. 4B and having the thickness of the tapered dielectric material layer as presented in FIG. 5. In the FIG. 6 graph 600, traces are presented for frequencies ranging from 2 MHz to 100 MHz. The trace for 2 MHz 602 shows an exponential increase in the field as the radial position moves outward from a central radial axis toward an outer edge. As the frequency increases from 2 MHz to 73.5 MHz, the exponential increase decreases until, at 73.5 MHz, the trace 604 is approximately flat along $E_z(r)/E_z(0) \approx 1.0$. As the frequency increases greater than 73.5 MHz toward 100 MHz, the field as the radial position becomes exponentially negative.

In another exemplary embodiment, the dielectric material layer 302 has a uniform thickness (t) radially from a center axis 320 to an outer edge 322.

For example, the dielectric material layer 302 can include at least two dielectric materials where the dielectric constant of a first dielectric material differs from a dielectric constant of a second dielectric material. To have a radially varying dielectric constant for the dielectric material layer 302, an embodiment of the dielectric material layer 302 has cross-sectional regions and the dielectric materials with different dielectric constants are located in different cross-sectional regions. The radial variation can be substantially continuous or discontinuous, depending on the dielectric materials chosen.

Figure 7:
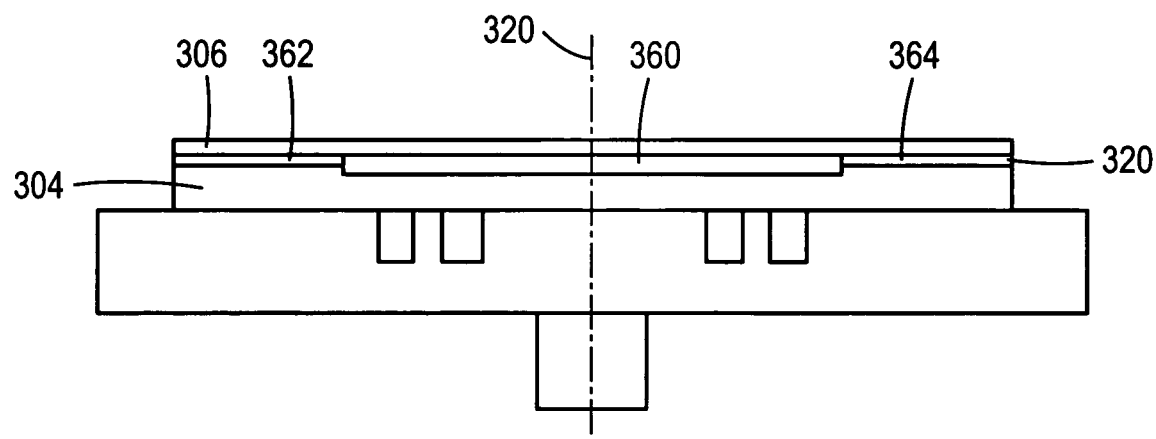
FIG. 7 shows a schematic cross-sectional view of another exemplary embodiment of an electrostatic chuck assembly with a dielectric material layer with a uniform thickness.

In one example schematically depicted in FIG. 7, the dielectric material layer 302 has three regions in cross-section, the three regions including a radially center region 360, a first radially edge region 362 and a second radially edge region 364. A dielectric constant of the dielectric material layer 302 in the radially center region 360 is lower than a dielectric constant of the dielectric material layer 302 in the first radially edge region 362 and the second radially edge region 364.

In exemplary embodiments of the electrostatic chuck assembly, the dielectric material layer includes boron nitride or aluminum nitride. Further, exemplary embodiments can include a dielectric material layer having a thickness of about 5 mm or less, alternatively about 2 mm or less.

Figure 8:
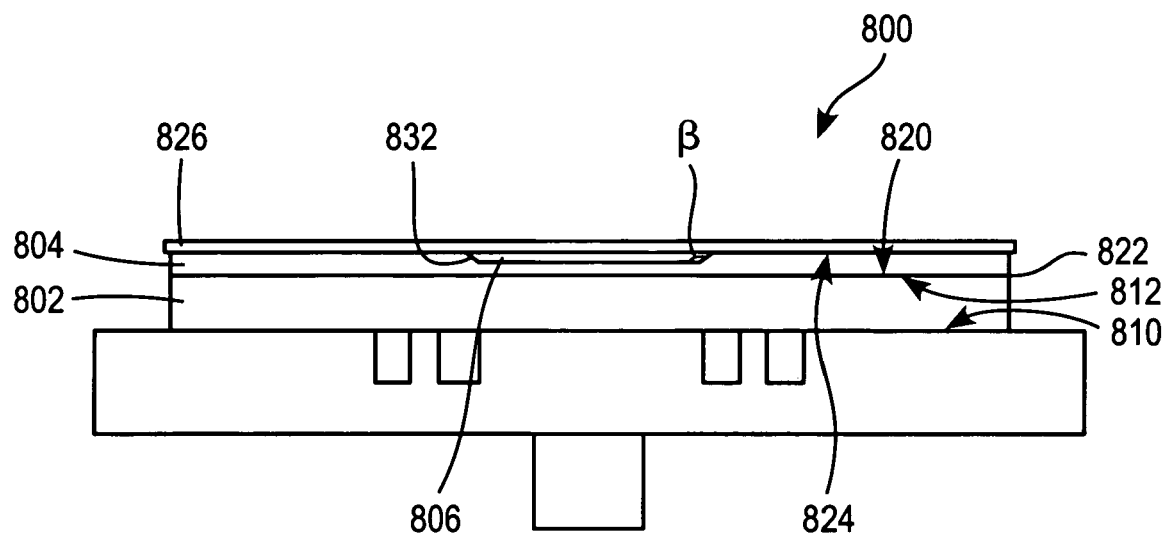
FIG. 8 shows a schematic cross-sectional view of a further exemplary embodiment of an electrostatic chuck assembly with a cavity in a seating surface of an electrostatic chuck ceramic layer.

FIG. 8 shows a schematic cross-sectional view of a further exemplary embodiment of an electrostatic chuck assembly with a cavity in a seating surface of an electrostatic chuck ceramic layer. In the exemplary embodiment, a cavity is formed in the electrostatic chuck ceramic layer at the seating surface for the workpiece. An exemplary embodiment of an electrostatic chuck assembly 800 comprises a conductive support 802, an electrostatic chuck ceramic layer 804, and a cavity 806 in a surface of the electrostatic chuck ceramic layer 804. The conductive support 802, formed of a conductive metal such as aluminum, is operatively connected to a connector for connection to a RF circuit of a plasma processing apparatus (not shown) for plasma processing a workpiece, such as a 200 mm or 300 mm wafer, seated on the electrostatic chuck ceramic layer 804.

In the electrostatic chuck assembly 800 in FIG. 8, the conductive support 802 has a first surface 810 and a second surface 812 and the electrostatic chuck ceramic layer 804 has a first surface 820 contacting the second surface 812 of the conductive support 802 to form a first interface 822 and has a second surface 824 to receive a workpiece 826. In a preferred embodiment, the cavity is a vacuum cavity.

Figure 9:
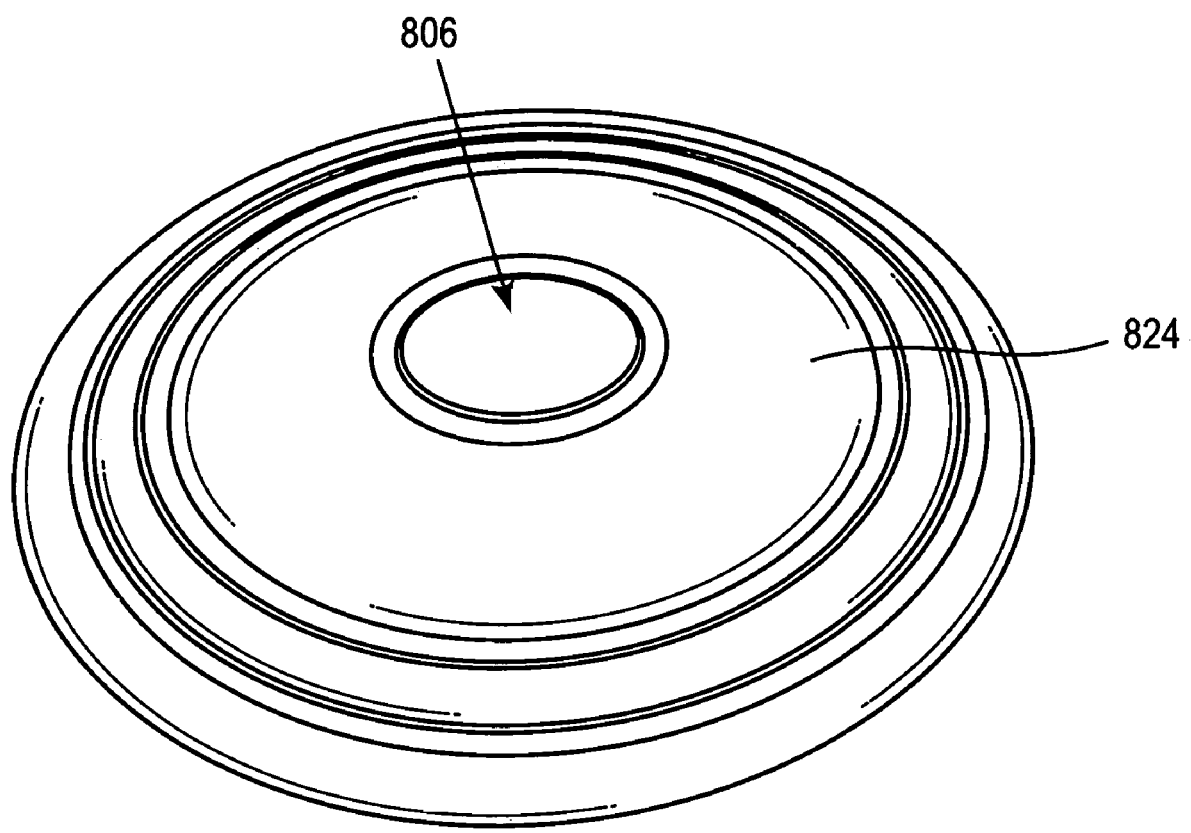
FIG. 9 is a photograph of the exemplary embodiment of an electrostatic chuck assembly in FIG. 8 showing the cavity in the seating surface of the electrostatic chuck ceramic layer.

As depicted schematically in FIG. 8 and photographically in FIG. 9, a cavity 806 is formed in the second surface 824 of the electrostatic chuck ceramic layer 804. The cavity 806 can take any shape. In one example, the cavity 806 is disc shaped or substantially disc-shaped, e.g., having an eccentricity of between 0 and 0.25. In another example, the cavity 806 has a radially varying cross-sectional thickness (t).

In a further example, an embodiment of the cavity 806 has an outer edge 832 having an average slope that forms a perpendicular angle (β) with a plane containing the second surface 824 of the electrostatic chuck ceramic layer 804. The angle (β) can be, in some embodiments, 90 degrees, e.g., the average slope and the second surface 824 of the electrostatic chuck ceramic layer 804 are perpendicular, and can, in other embodiments, deviate from 90 degrees, e.g., the average slope and the second surface 824 of the electrostatic chuck ceramic layer 804 are non-perpendicular. In a preferred embodiment, the angle (β) is in a range of greater than zero to less than or equal to 45 degrees, alternatively less than 15 degrees, alternatively less than 6 degrees, and alternatively less than 3 degrees. As shown herein, the angle affects the shape of the electric field formed in the plasma processing process.

Figure 10:
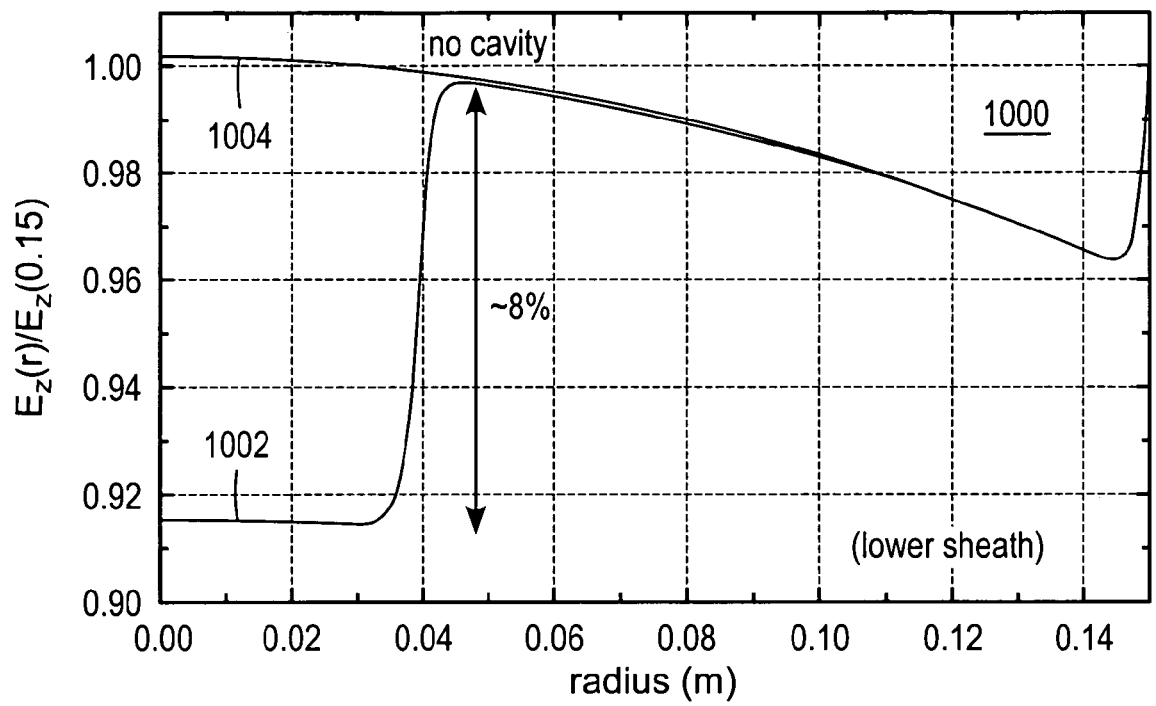
FIG. 10 is a graph showing the change in field as a function of radial distance for edge for the exemplary embodiment of an electrostatic chuck assembly in FIG. 8 with the cavity in the seating surface of the electrostatic chuck ceramic layer and for an electrostatic chuck without the cavity.

FIG. 10 is a graph 1000 showing the change in electric field ($E_z(r)/E_z(0.15)$) as a function of radial distance (r) from a central axis toward an outer edge. In the graph, the electric field is normalized to the value of the electric field at 15 cm. The graph 1000 shows the electric field for a first trace 1002 corresponding to the exemplary embodiment of the electrostatic chuck assembly in FIG. 8 with the cavity in the seating surface of the electrostatic chuck ceramic layer and the electric field for a second trace 1004 corresponding to an electrostatic chuck without a cavity 1004. The radius of the cavity was approximately 4 cm and the radius of the electrostatic chuck ceramic layer was approximately 15 cm. The inclusion of a cavity in the seating surface of the electrostatic chuck ceramic layer is shown decreasing the electric field. As can be seen in FIG. 10, a step change in electric field occurs at the radial outer edge of the cavity. The graph 1000 shows a large change, approximately 8%, in the electric field at a radial position approximating the radial outer edge of the cavity as compared to an electrostatic chuck assembly without a cavity.

Figure 11:
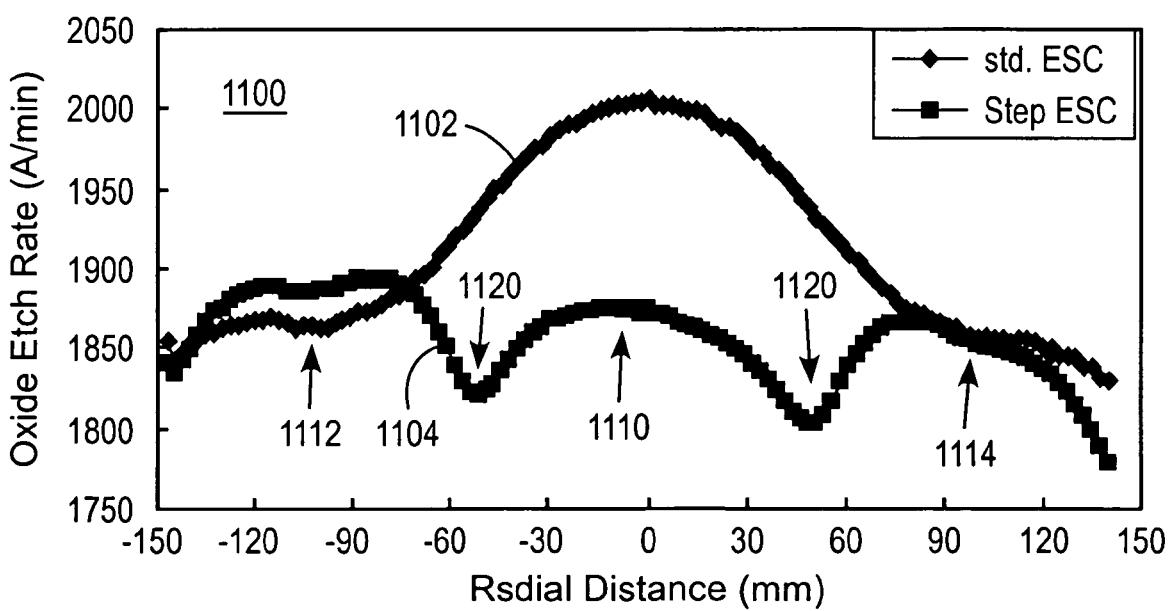
FIG. 11 is a graph of oxide etch rate as a function of radial position for a standard electrostatic chuck assembly and for an exemplary embodiment of an electrostatic chuck assembly with a cavity in a seating surface of an electrostatic chuck ceramic layer.

FIG. 11 is a graph 1100 of oxide etch rate (in Å/min) as a function of radial position (in mm) for a standard electrostatic chuck assembly and for an exemplary embodiment of an electrostatic chuck assembly with a cavity in a seating surface of an electrostatic chuck ceramic layer. In the graph, trace 1102 is for the standard electrostatic chuck assembly and trace 1104 is for the exemplary embodiment of an electrostatic chuck assembly with a cavity in a seating surface of an electrostatic chuck ceramic layer. Trace 1102 has an approximate bell curve shape, with outer regions from ±90 mm to ±150 mm of lower and approximately constant etch rate and a center region of ±90 mm with an increased etch rate (over that of the outer regions) centered on a radial distance of 0 mm. Trace 1104 has an overall more uniform etch rate across the entire radial distance of 0 to ±150 mm. Trace 1104 exhibits three regions—a center region 1110, a first outer region 1112 and a second outer region 1114. The etch rate in each of the three regions is approximately the same, being about 1880±10 Å/min. Between each of the outer regions and the center region is an area of relatively decreased etch rate 1120, forming a dip in the etch rate curve. These areas of relatively decreased etch rate 1120 are located in positions that correspond to the radial position of the cavity edge.

Figure 12A:
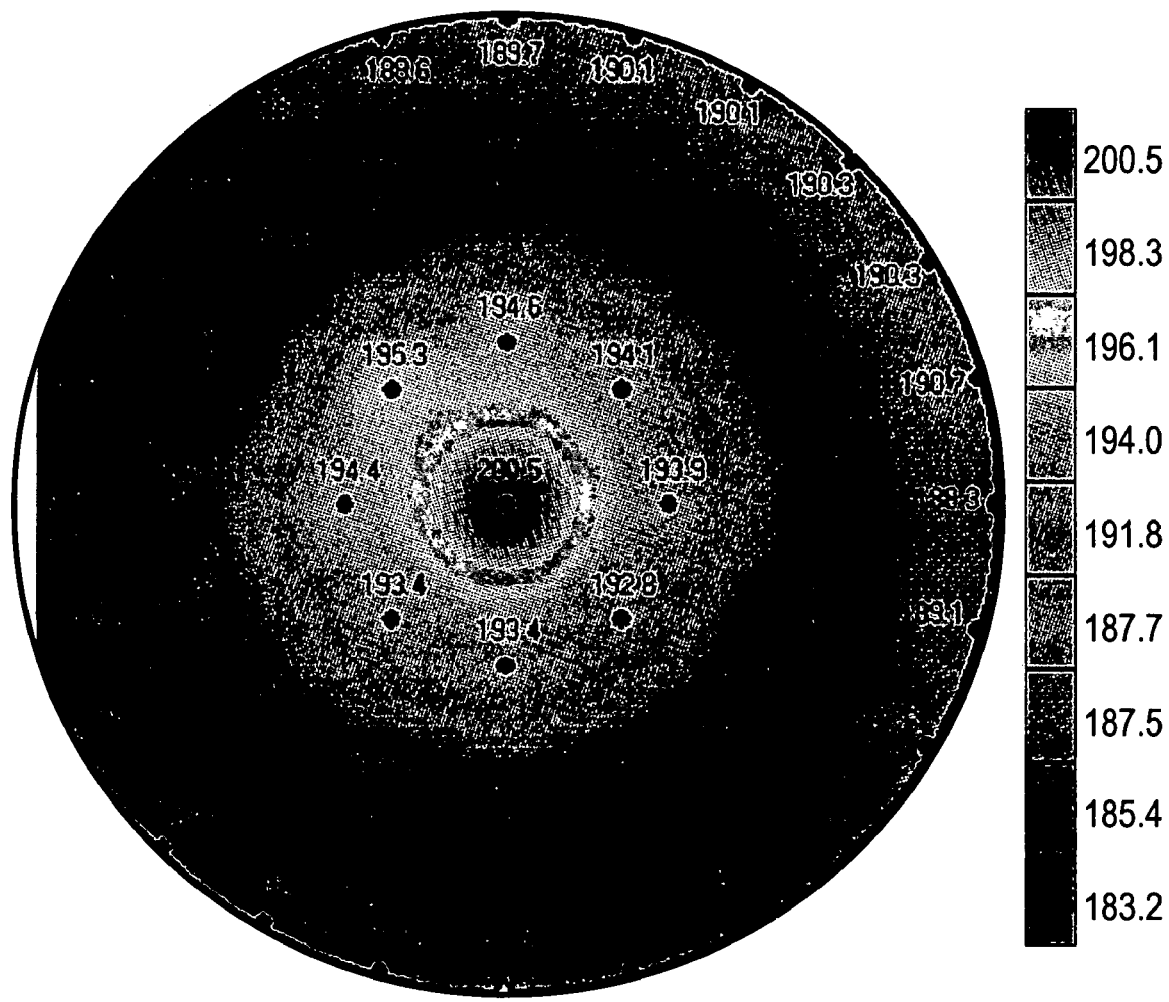
FIG. 12A and FIG. 12B show the azimuthal variation in height of an etched workpiece.
Figure 12B:
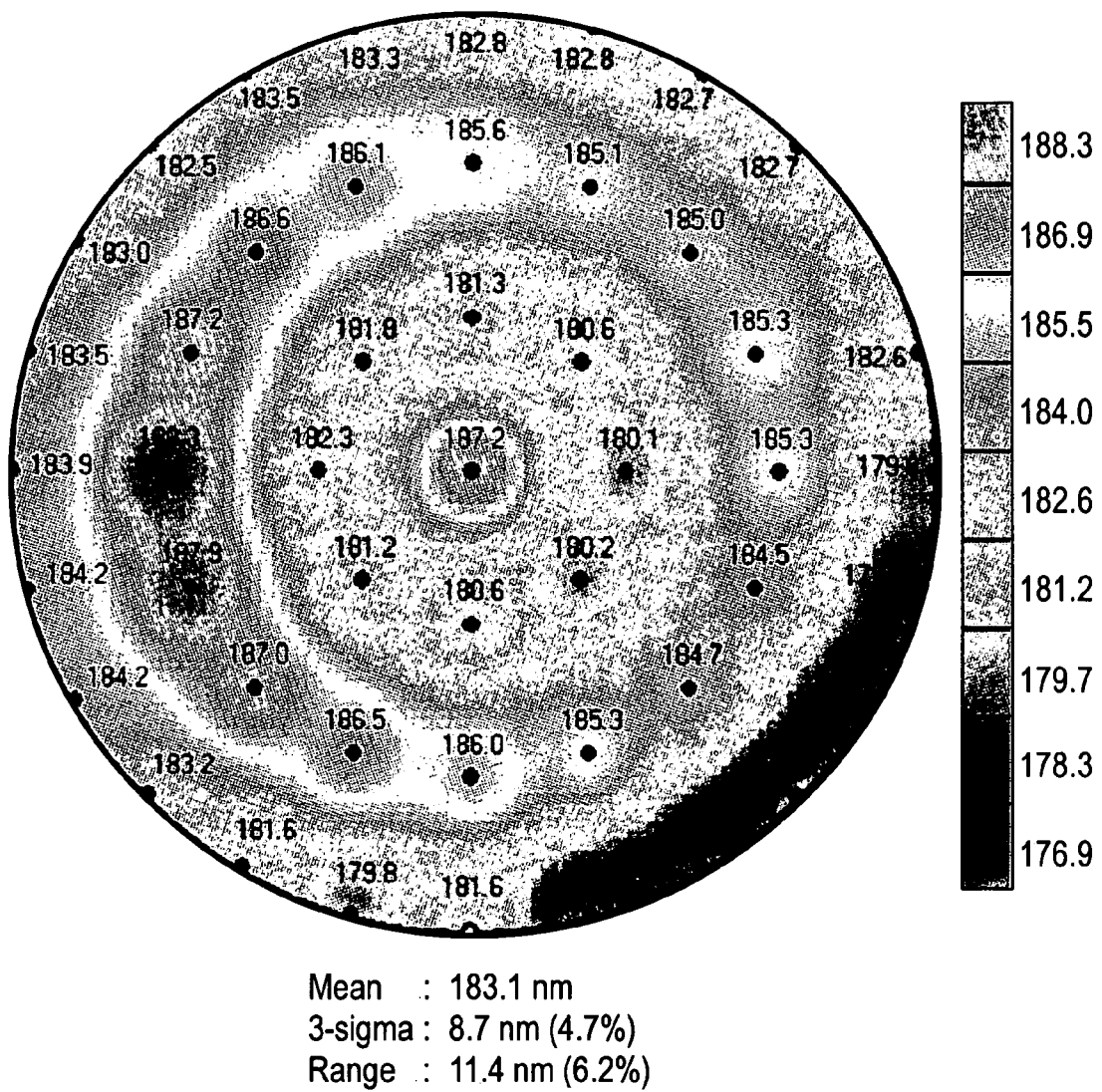

FIG. 12A and FIG. 12B show the azimuthal variation in height of an etched workpiece. FIG. 12A is the result for a workpiece on a standard electrostatic chuck assembly and FIG. 12B is the result for a workpiece on an exemplary embodiment of an electrostatic chuck assembly with a cavity in a seating surface of an electrostatic chuck ceramic layer. The different etch rates have different shading. As shown in FIG. 12A for a workpiece on a standard electrostatic chuck, the azimuthal variation in height has a mean value of 187.8 nm, a 3-sigma value of 11.8 nm (6.3%) and a range of 17.3 nm (9.2%). As shown in FIG. 12B for a workpiece on an exemplary embodiment of an electrostatic chuck assembly with a cavity in a seating surface of an electrostatic chuck ceramic layer, the azimuthal variation in height has a mean value of 183.1 nm, a 3-sigma value of 8.7 nm (4.7%), and a range of 11.4 nm (6.2%). Thus, comparing the two results, one can seen that the results for a workpiece on an exemplary embodiment of an electrostatic chuck assembly with a cavity in a seating surface of an electrostatic chuck ceramic layer (FIG. 12B) exhibit a more uniform height with a lower variation and range of heights across the entire wafer surface. In general, typical ranges for azimuthal variation for a workpiece on an exemplary embodiment of an electrostatic chuck assembly with a cavity in a seating surface of an electrostatic chuck ceramic layer are expected to have a 3-sigma value of less than about 5%, alternatively less than about 4%, and a range of less than about 7%, alternatively less than about 5%.

A pole pattern can optionally be embedded in the electrostatic chuck ceramic layer of exemplary embodiments of the electrostatic chuck assembly.

Figure 13:
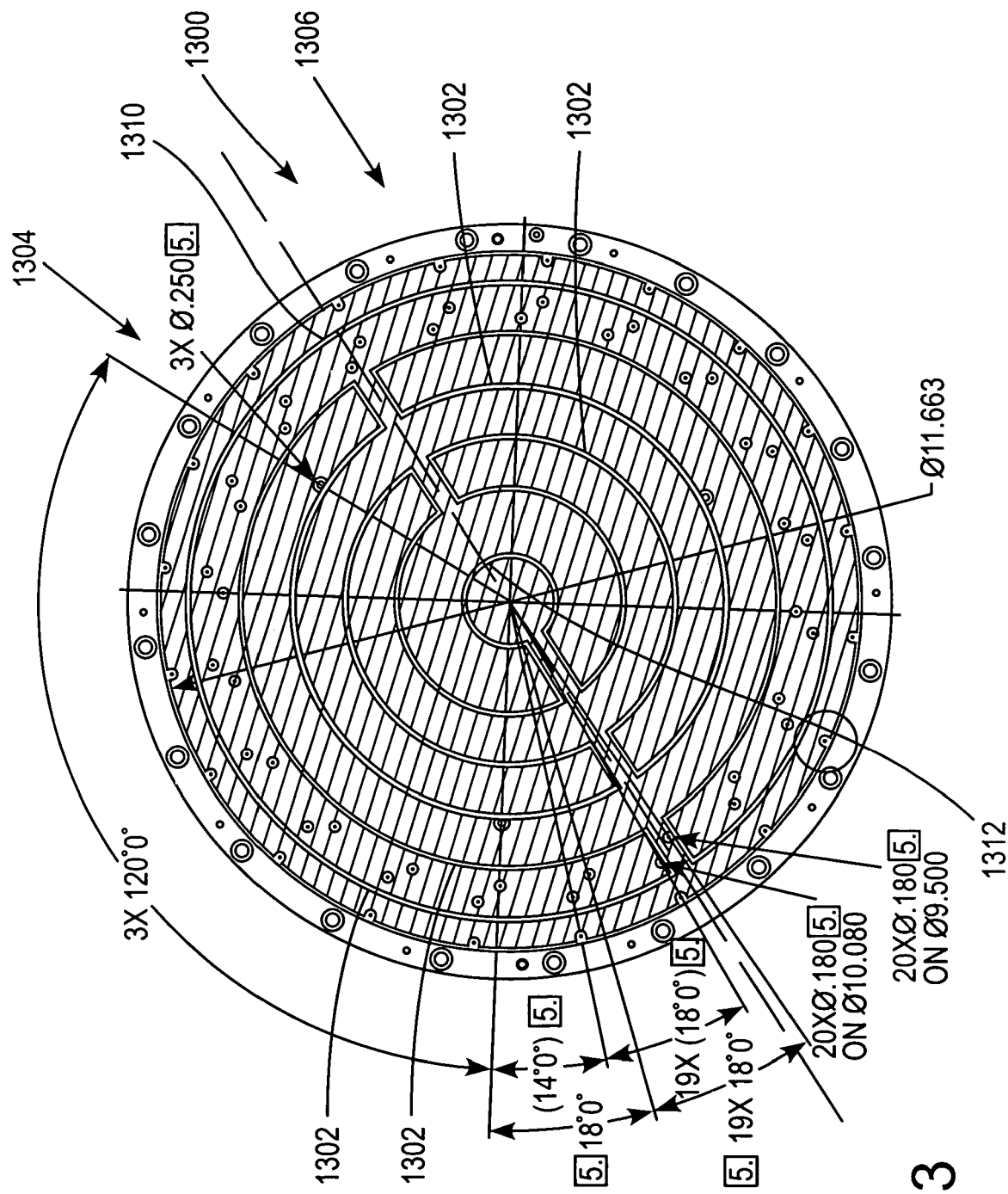
FIG. 13 is a schematic diagram showing an exemplary embodiment of a pole pattern.

FIG. 13 is a schematic diagram showing an exemplary embodiment of a pole pattern. A pole pattern can suppress or prevent RF current from traveling from the edge of the wafer to the center. This effect can be used to force etching power to desired portions and/or paths of the system to, generally, decrease etching power in a central region, to increase etching power in a peripheral region, and/or more closely match etching power in a central region to etching power in a peripheral region.

Figure 14:
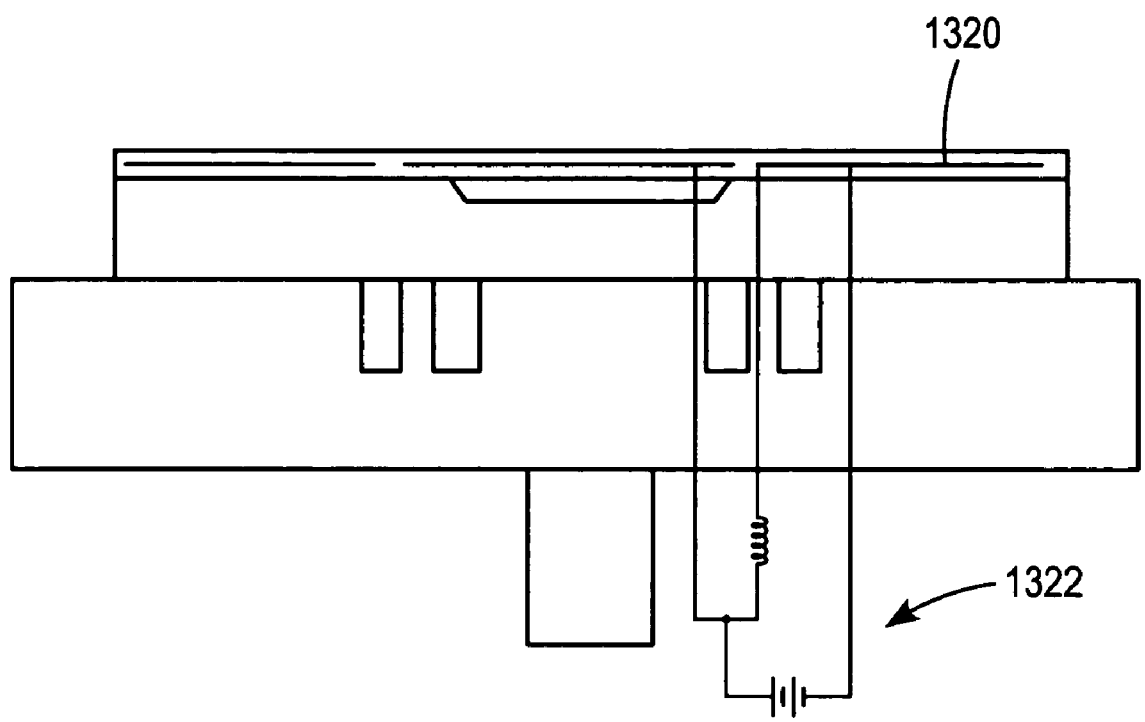
FIG. 14 shows a schematic cross-sectional view of an exemplary embodiment of an electrostatic chuck assembly with an embedded pole pattern in the electrostatic chuck ceramic layer.

In the pole pattern 1300 shown in FIG. 13, a continuous line is formed into an arrangement of radially distributed regions. These radially distributed regions help to differentiate different portions or regions of the seating surface of the electrostatic chuck. For example, a first hemisphere 1304 of concentric semicircles 1302 is substantially separated from a second hemisphere 1306 of concentric semicircles 1302 by weaving the continuous line within one of the hemispheres and then at an outer point 1310 and at an inner point 1312 joining the hemispheres. This produces a discontinuous pole pattern 1320 across a radial dimension of the electrostatic chuck, e.g., split into different regions that are radially or circumferentially separated, as seen in the schematic cross-sectional view of an exemplary embodiment of an electrostatic chuck assembly with an embedded pole pattern in the electrostatic chuck ceramic layer shown in FIG. 14. The different regions can be coupled to each other by a high inductive coupling. In addition to the discontinuous pole pattern 1320, FIG. 14 also shows a general arrangement of a circuit 1322 electrically connected to the discontinuous pole pattern 1320.

Exemplary embodiments of the pole pattern are preferably formed of a conductive material including tungsten. When the pole pattern is formed of a conductive material including tungsten, the width of the continuous line is approximately 0.10 inches. It will be appreciated that various pole patterns can be used, including radially continuous and radially discontinuous embedded pole patterns, and that the dimensions and arrangement of the pole patterns can change based on, among other things, the composition of the conductive material forming the pole pattern and the desired radial distribution of energy density.

Figure 15:
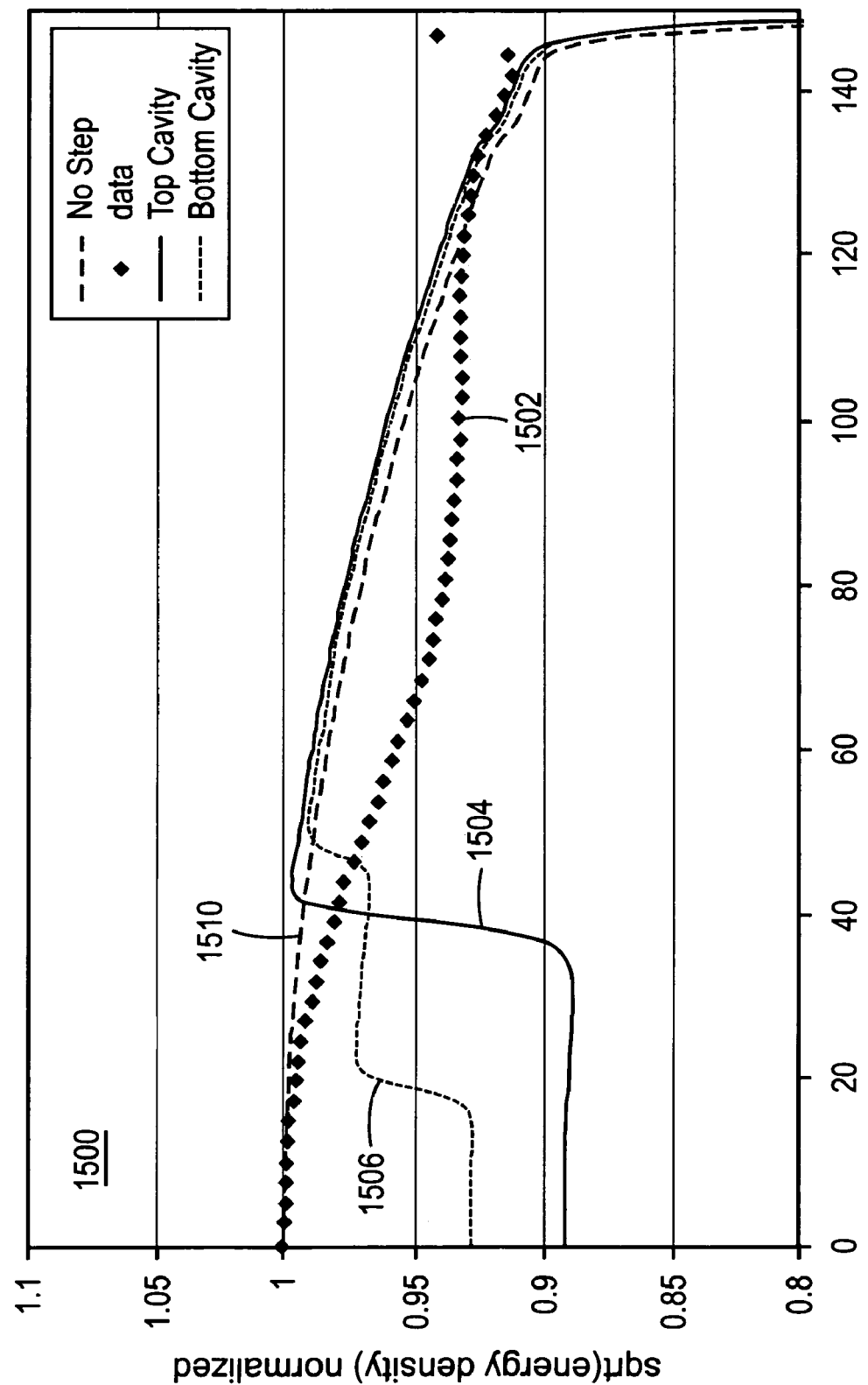
FIG. 15 is a graph of normalized energy density as a function of radial position for various embodiments of electrostatic chuck assemblies with an embedded pole pattern in the electrostatic chuck ceramic layer where the embedded pole pattern is discontinuous across the radial dimension.

FIG. 15 is a graph of normalized energy density as a function of radial position (in mm) for various embodiments of electrostatic chuck assemblies with an embedded pole pattern in the electrostatic chuck ceramic layer where the embedded pole pattern is discontinuous across the radial dimension. In the FIG. 15 graph 1500, trace 1502 is for an electrostatic chuck assembly having an embedded pole pattern that is discontinuous across the radial dimension; trace 1504 is for an electrostatic chuck assembly having an embedded pole pattern that is discontinuous across the radial dimension and having a cavity in a seating surface of an electrostatic chuck ceramic layer, e.g., an electrostatic chuck assembly similar to FIG. 8 with an embedded pole pattern similar to FIG. 14; trace 1506 is for an electrostatic chuck assembly having an embedded pole pattern that is discontinuous across the radial dimension and having a cavity formed in the conductive support below an electrostatic chuck ceramic layer, e.g., an electrostatic chuck assembly similar to FIG. 1 with an embedded pole pattern similar to FIG. 14. For comparison, trace 1510 shows the normalized energy density for a standard electrostatic chuck, e.g., an electrostatic chuck without a cavity, without a dielectric insert or layer and without an embedded pole pattern.

As seen in FIG. 15, the presence of the radially discontinuous embedded pole pattern alone can influence the radial distribution of energy density. In addition, the radially discontinuous embedded pole pattern in combination with dielectric material and/or cavity having varying thickness, profile and/or shape can further influence the radial distribution of energy density. In each case, it is shown that selection of these features, alone or in combination produces a tailored radial distribution of energy density, preferably a more uniform radial distribution of energy density.

Figure 16:
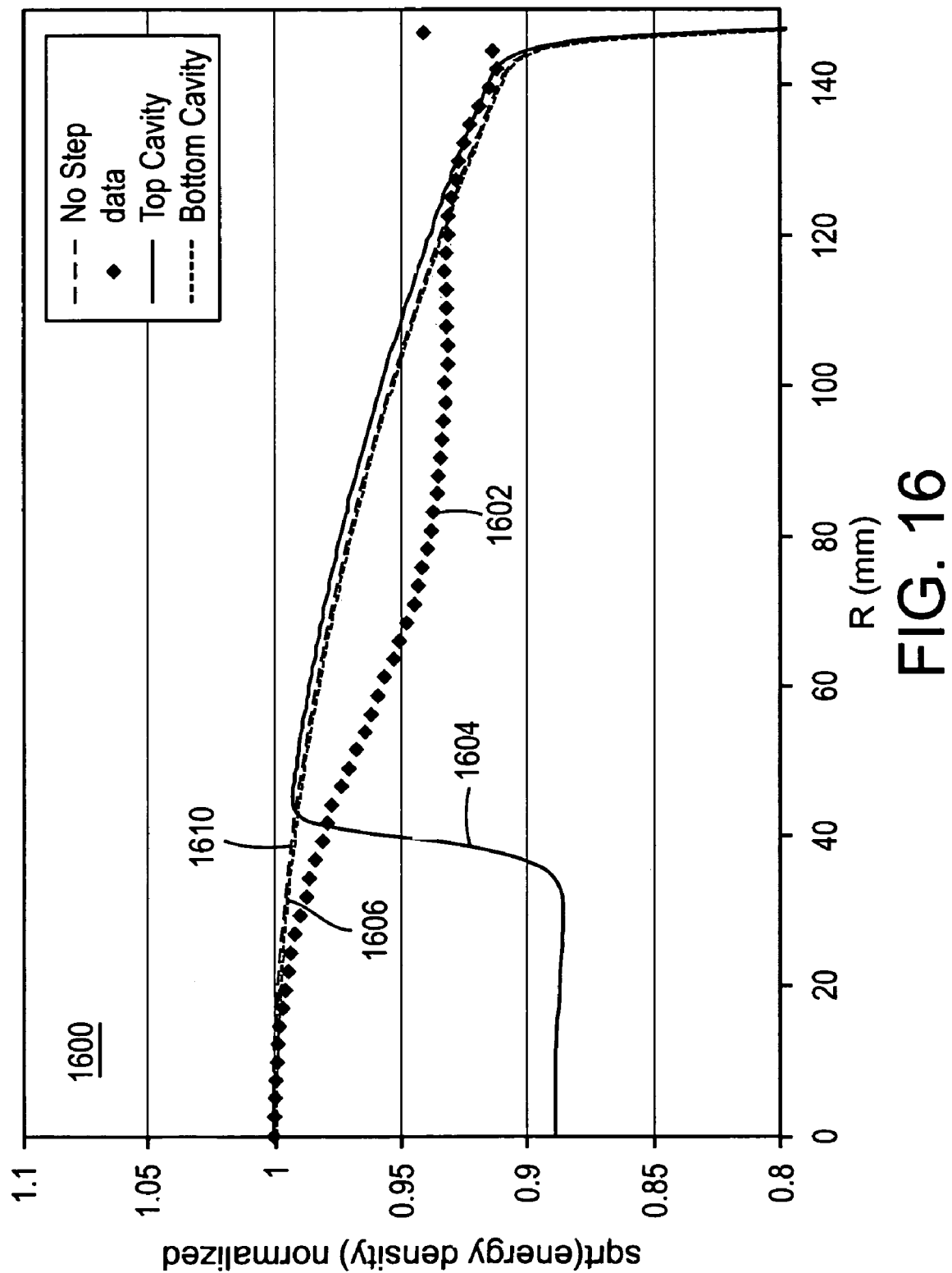
FIG. 16 is a graph of normalized energy density as a function of radial position for various embodiments of electrostatic chuck assemblies with an embedded pole pattern in the electrostatic chuck ceramic layer where the embedded pole pattern is continuous across the radial dimension.

FIG. 16 is a graph of normalized energy density as a function of radial position (in mm) for various embodiments of electrostatic chuck assemblies with an embedded pole pattern in the electrostatic chuck ceramic layer where the embedded pole pattern is continuous across the radial dimension. In the FIG. 16 graph 1600, trace 1602 is for an electrostatic chuck assembly having an embedded pole pattern that is continuous across the radial dimension; trace 1604 is for an electrostatic chuck assembly having an embedded pole pattern that is continuous across the radial dimension and having a cavity in a seating surface of an electrostatic chuck ceramic layer, e.g., an electrostatic chuck assembly similar to FIG. 8 with the noted embedded pole pattern; trace 1606 is for an electrostatic chuck assembly having an embedded pole pattern that is continuous across the radial dimension and having a cavity formed in the conductive support below an electrostatic chuck ceramic layer, e.g., an electrostatic chuck assembly similar to FIG. 1 with the noted embedded pole pattern. For comparison, trace 1610 shows the normalized energy density for a standard electrostatic chuck, e.g., an electrostatic chuck without a cavity, without a dielectric insert or layer and without an embedded pole pattern.

The electrostatic chuck assemblies disclosed herein can be manufactured by any one of various methods.

An exemplary method of manufacturing an electrostatic chuck assembly comprises forming a cavity in a region of a surface of the conductive support, the surface in contact with the electrostatic chuck ceramic layer, and incorporating a dielectric material into the cavity. The cavity can be formed by any means, including molding, selective deposition, milling or other removal methods.

Another exemplary method of manufacturing an electrostatic chuck assembly comprises forming a multilayer structure, including the conductive support and the electrostatic chuck ceramic layer, and at least one of forming a cavity in a region of a free-surface of the electrostatic chuck ceramic layer and forming a dielectric material layer between the conductive support and the electrostatic chuck ceramic layer. The multilayer can be built up sequentially by, for example, sequential deposition of the various layers with interjected milling and forming operations. For example, where the method comprises forming a dielectric material layer between the conductive support and the electrostatic chuck ceramic layer, the dielectric material layer can be formed with a tapered surface in contact with the conductive support. The conductive support itself can first be complementarily tapered to the form of the dielectric material layer by, for example, a milling operation, and the electrostatic chuck ceramic layer can then be deposited on the milled tapered surface or can be formed separately with a formed complementarily tapered surface. In another example, the dielectric material layer has regions of various thicknesses, e.g., a stepped thickness, a combination of uniform regions and tapered or stepped regions, and so forth. The conductive support is formed with a complementary surface profile to the dielectric material layer by, for example, a milling operation, and the electrostatic chuck ceramic layer can then be deposited on the milled surface or can be formed separately with a formed complementarily tapered surface.

It is to be appreciated that the electrostatic chuck assemblies disclosed herein can be manufactured as original equipment for plasma processing apparatus. In addition, the electrostatic chuck assemblies disclosed herein can be manufactured by retrofitting existing electrostatic chuck assemblies to include one of the features disclosed, e.g., to include an embedded pole pattern and/or a dielectric material and/or cavity having varying thickness, profile and/or shape. For example, an existing electrostatic chuck assembly can have a cavity formed in a seating surface of the electrostatic chuck ceramic layer by, for example, milling, and if desired a dielectric material insert or layer can be preformed and bonded to the cavity or formed directly in the cavity by a deposition technique.

Figure 17:
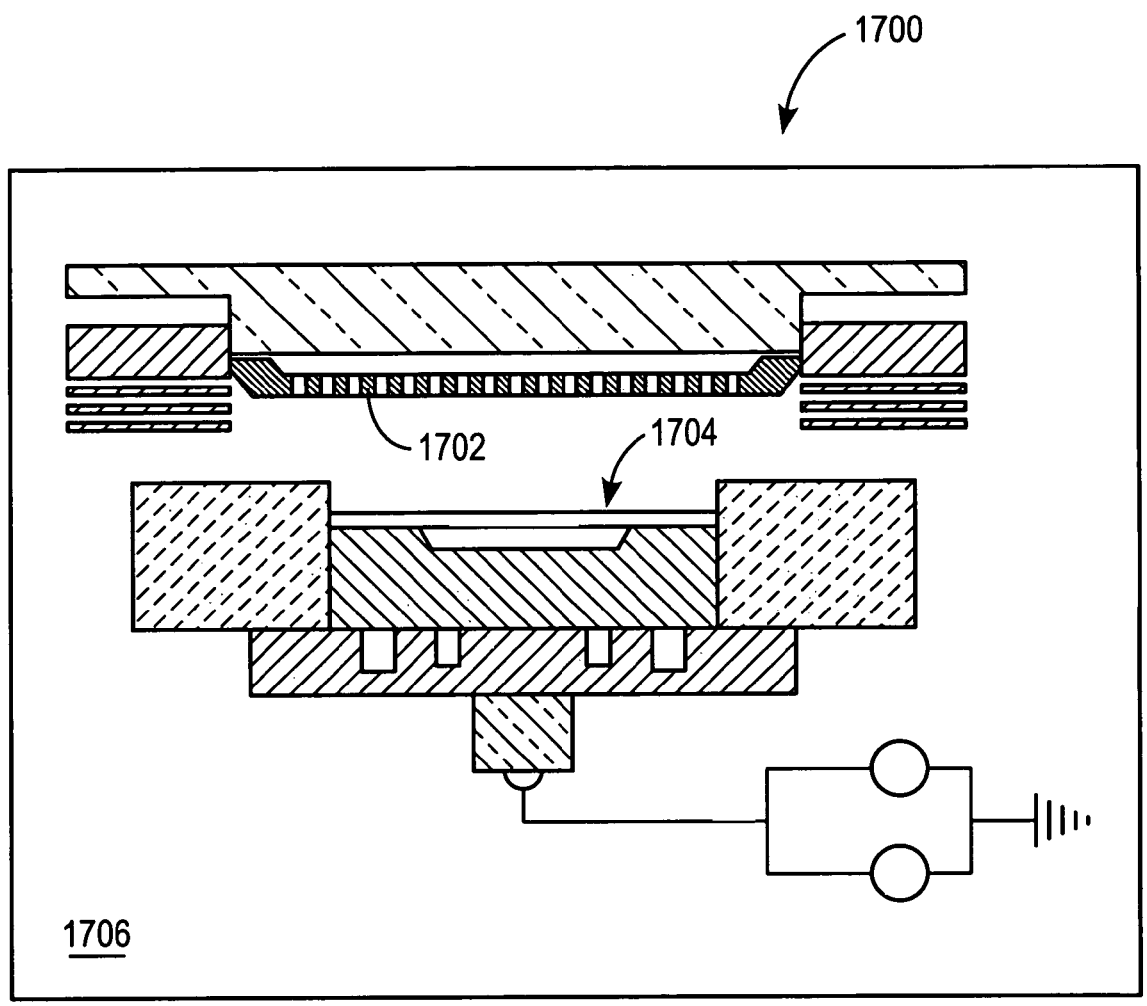
FIG. 17 shows a schematic cross-sectional view of an exemplary embodiment of a plasma processing apparatus.

FIG. 17 shows a schematic cross-sectional view of an exemplary embodiment of a plasma processing apparatus 1700. The plasma processing apparatus 1700 in FIG. 17 is a parallel plate reactor having an upper showerhead electrode 1702 facing the workpiece seating surface 1704 of an electrostatic chuck assembly arranged within a reactor vessel 1706. Any of the electrostatic chuck assemblies disclosed herein can be incorporated into the plasma processing apparatus.

Any of the electrostatic chuck assemblies disclosed herein and incorporated into a plasma processing apparatus can improve the uniformity of a flux field above a workpiece during a plasma processing process.

An exemplary method to improve the uniformity of a flux field above a workpiece during a plasma processing process comprises incorporating a dielectric material into a region an electrostatic chuck assembly, mounting the workpiece to the electrostatic chuck assembly, and establishing the flux field above the workpiece. A value of the flux field above the region with the incorporated dielectric material during the plasma processing process is less than an original value of the flux field for an electrostatic chuck without the incorporated dielectric material. For example, FIG. 2 shows reductions in energy densities, which relates to flux fields. An exemplary method optionally embeds a pole pattern in the electrostatic chuck ceramic layer.

The region with the incorporated dielectric material can vary. For example, the region can be between a conductive support operatively connected to a connector for connection to a RF circuit of a processing apparatus and an electrostatic chuck ceramic layer.

In one example, incorporating includes forming a cavity in a first region of a first surface of the conductive support. The dielectric material is located in the cavity and the electrostatic chuck ceramic layer contacts both the first surface of the conductive support and a surface of the dielectric material. In an exemplary embodiment, the dielectric material insert is a disc and the dielectric material has a radially varying cross-sectional thickness. An outer edge of the formed cavity and an outer edge of the dielectric material meet at an interface that forms an angle with a plane containing the first surface of the conductive support. The angle can be perpendicular or non-perpendicular.

In another example, incorporating includes forming a layer of the dielectric material between a first surface of the conductive support and a first surface of the electrostatic chuck ceramic layer. In an exemplary embodiment, the layer is formed from one dielectric material and has a thickness that varies radially from a center axis to an outer edge.

In a further example, incorporating includes forming a layer of the dielectric material between a first surface of the conductive support and a first surface of the electrostatic chuck ceramic layer. In an exemplary embodiment, the layer has three regions in cross-section and the layer of the dielectric material is thicker in a radially center region than in either of a first radially edge region or a second radially edge region.

In a still further example, incorporating includes forming a layer of the dielectric material between a first surface of the conductive support and a first surface of the electrostatic chuck ceramic layer. In an exemplary embodiment, the layer has a uniform thickness and the layer has three regions in cross-section. The three regions include a radially center region, a first radially edge region and a second radially edge region. A dielectric constant of the dielectric material in the radially center region is lower than a dielectric constant of the dielectric material in the first radially edge region and the second radially edge region.

Another exemplary method to improve the uniformity of a flux field above a workpiece during a plasma processing process comprises forming a cavity in an outer surface of an electrostatic chuck ceramic layer of an electrostatic chuck, mounting the workpiece to the outer surface of the electrostatic chuck so that the cavity is covered by the workpiece, and establishing the flux field above the workpiece. A value of the flux field above the region with the incorporated dielectric material during the plasma processing process is less than an original value of the flux field for an electrostatic chuck without the incorporated dielectric material. For example, FIG. 10 shows reductions in energy densities and FIG. 11 shows changes in etch rate, both of which relate to flux fields. An exemplary method optionally embeds a pole pattern in the electrostatic chuck ceramic layer.

The region with the cavity can vary. For example, the region can be in a seating surface of an electrostatic chuck ceramic layer.

In an example, the formed cavity has a radially varying cross-sectional thickness. In another example, an outer edge of the formed cavity forms an angle with a plane containing the outer surface of the electrostatic chuck ceramic layer. The angle can perpendicular or non-perpendicular.

Although the present invention has been described in connection with preferred embodiments thereof, it will be appreciated by those skilled in the art that additions, deletions, modifications, and substitutions not specifically described may be made without departing from the spirit and scope of the invention as defined in the appended claims.

What is claimed is:

1. An electrostatic chuck assembly for a plasma processing apparatus, the electrostatic chuck assembly comprising:
   a conductive support electrically connected to a RF circuit of the plasma processing apparatus;
   an electrostatic chuck ceramic layer having a first surface in contact with the conductive support at a first region of a first interface and a second opposing surface for seating of a semiconductor substrate;
   a cavity in the conductive support at a second region of the first interface; and
   a dielectric material insert in the cavity, wherein an outer edge of the cavity and an outer edge of the dielectric material insert meet at a second interface and wherein the second interface has an average slope that forms a perpendicular or non-perpendicular angle with a plane containing the first interface.

2. The electrostatic chuck assembly of claim 1, wherein the dielectric material insert occupies essentially all of a volume of the cavity and has a first surface continuous with the first interface.

3. The electrostatic chuck assembly of claim 2, wherein the first surface of the dielectric material insert is planar with the first interface.

4. The electrostatic chuck assembly of claim 1, wherein the dielectric material insert is a disc and the dielectric material insert has a radially varying cross-sectional thickness.

5. The electrostatic chuck assembly of claim 1, wherein the non-perpendicular angle is in a range of greater than zero to less than or equal to 45 degrees.

6. The electrostatic chuck assembly of claim 1, wherein the dielectric material insert includes boron nitride or aluminum nitride.

7. The electrostatic chuck assembly of claim 1, wherein the dielectric material insert includes boron nitride or aluminum nitride, the dielectric material insert is substantially disc-shaped having a diameter of about 12 cm or less and a thickness of about 5 mm or less.

8. The electrostatic chuck assembly of claim 1, comprising a pole pattern embedded in the electrostatic chuck ceramic layer.

9. The electrostatic chuck assembly of claim 8, wherein the pole pattern is discontinuous across a radial dimension of the electrostatic chuck.

10. A plasma processing apparatus comprising the electrostatic chuck assembly of claim 1.

11. An electrostatic chuck assembly for a plasma processing apparatus, the electrostatic chuck assembly comprising:
    a conductive support electrically connected to a RF circuit of the plasma processing apparatus, the conductive support having a first surface and a second surface;
    an electrostatic chuck ceramic layer having a first surface contacting the second surface of the conductive support to form a first interface and having a second surface to receive a workpiece; and
    a cavity in the second surface, wherein an outer edge of the cavity has an average slope that forms a perpendicular or non-perpendicular angle with a plane containing the second surface.

12. The electrostatic chuck assembly of claim 11, wherein the cavity is substantially disc-shaped and has a radially varying cross-sectional thickness.

13. The electrostatic chuck assembly of claim 11, wherein the non-perpendicular angle is in a range of greater than zero to less than or equal to 45 degrees.

14. The electrostatic chuck assembly of claim 11, comprising a pole pattern embedded in the electrostatic chuck ceramic layer.

15. The electrostatic chuck assembly of claim 14, wherein the pole pattern is discontinuous across a radial dimension of the electrostatic chuck.

16. A plasma processing apparatus comprising the electrostatic chuck assembly of claim 11.

17. A method of manufacturing the electrostatic chuck assembly of claim 1, the method comprising:
forming the cavity in the second region of the first interface of the conductive support; and
incorporating the dielectric material into the cavity.

18. A method to improve the uniformity of a flux field above a workpiece during a plasma processing process, the method comprising:
incorporating a dielectric material into a region of an electrostatic chuck assembly;
mounting the workpiece to the electrostatic chuck assembly; and
establishing the flux field above the workpiece,
wherein a value of the flux field above the region with the incorporated dielectric material during the plasma processing process is less than an original value of the flux field for an electrostatic chuck assembly without the incorporated dielectric material, and
wherein the region with the incorporated dielectric material is between a conductive support electrically connected to a RF circuit of a processing apparatus and an electrostatic chuck ceramic layer.

19. The method of claim 18, wherein incorporating includes
forming a cavity in a first region of a first surface of the conductive support,
wherein the dielectric material is located in the cavity,
wherein the electrostatic chuck ceramic layer contacts both the first surface of the conductive support and a surface of the dielectric material.

20. The method of claim 19, wherein the dielectric material insert is a disc and the dielectric material has a radially varying cross-sectional thickness.

21. The method of claim 19, wherein an outer edge of the formed cavity and an outer edge of the dielectric material meet at an interface that forms a perpendicular angle with a plane containing the first surface of the conductive support.

22. The method of claim 19, wherein an outer edge of the formed cavity and an outer edge of the dielectric material meet at an interface that forms a non-perpendicular angle with a plane containing the first surface of the conductive support.

23. The method of claim 19, wherein the dielectric material includes boron nitride or aluminum nitride, the dielectric material is substantially disc-shaped having a diameter of about 12 cm or less and a thickness of about 5 mm or less.

24. The method of claim 18, wherein incorporating includes
forming a layer of the dielectric material between a first surface of the conductive support and a first surface of the electrostatic chuck ceramic layer,
wherein the layer is formed from one dielectric material and has a thickness that varies radially from a center axis to an outer edge.

25. The method of claim 18, wherein incorporating includes
forming a layer of the dielectric material between a first surface of the conductive support and a first surface of the electrostatic chuck ceramic layer,
wherein the layer has three regions in cross-section and the layer of the dielectric material is thicker in a radially center region than in either of a first radially edge region or a second radially edge region.

26. The method of claim 18, wherein incorporating includes
forming a layer of the dielectric material between a first surface of the conductive support and a first surface of the electrostatic chuck ceramic layer,
wherein the layer has a uniform thickness and
wherein the layer has three regions in cross-section, the three regions including a radially center region, a first radially edge region and a second radially edge region, and wherein a dielectric constant of the dielectric material in the radially center region is lower than a dielectric constant of the dielectric material in the first radially edge region and the second radially edge region.

27. The method of claim 18, comprising embedding a discontinuous pole pattern in the electrostatic chuck ceramic layer.

28. A method to improve the uniformity of a flux field above a workpiece during a plasma processing process, the method comprising:
forming a cavity in an outer surface of an electrostatic chuck ceramic layer of an electrostatic chuck assembly;
mounting the workpiece to the outer surface of the electrostatic chuck ceramic layer so that the cavity is covered by the workpiece; and
establishing the flux field above the workpiece,
wherein a value of the flux field above the region with the incorporated dielectric material during the plasma processing process is less than an original value of the flux field for an electrostatic chuck assembly without the incorporated dielectric material.

29. The method of claim 28, wherein the formed cavity has a radially varying cross-sectional thickness.

30. The method of claim 28, wherein an outer edge of the formed cavity forms a perpendicular angle with a plane containing the outer surface of the electrostatic chuck ceramic layer.

31. The method of claim 28, wherein an outer edge of the formed cavity forms a non-perpendicular angle with a plane containing the outer surface of the electrostatic chuck ceramic layer.

32. The method of claim 28, comprising embedding a discontinuous pole pattern in the electrostatic chuck ceramic layer.

* * * * *